United States Patent
Jeon (10) Patent No.: US 7,177,174 B2
(45) Date of Patent: Feb. 13, 2007

(54) FERROELECTRIC MEMORY DEVICE HAVING A REFERENCE VOLTAGE GENERATING CIRCUIT

(75) Inventor: Byung-Gil Jeon, Gyeongg-do (KR)

(73) Assignee: Samsung Electronics Co., Ltd., Suwons-si (KR)

( * ) Notice: Subject to any disclaimer, the term of this patent is extended or adjusted under 35 U.S.C. 154(b) by 47 days.

(21) Appl. No.: 11/014,117

(22) Filed: Dec. 15, 2004

(65) Prior Publication Data

US 2005/0128782 A1 Jun. 16, 2005

(30) Foreign Application Priority Data

Dec. 15, 2003 (KR) ...................... 10-2003-0091049

(51) Int. Cl.
*G11C 11/22* (2006.01)
(52) U.S. Cl. ...................... 365/145; 365/117; 365/149; 365/189.09
(58) Field of Classification Search ................ 365/145, 365/149, 117, 189.09
See application file for complete search history.

(56) References Cited

U.S. PATENT DOCUMENTS

| | | | |
|---|---|---|---|
| 5,517,445 A * | 5/1996 | Imai et al. .................. 365/145 |
| 5,572,459 A | 11/1996 | Wilson et al. |
| 5,608,667 A | 3/1997 | Osawa |
| 5,880,989 A * | 3/1999 | Wilson et al. ............... 365/145 |
| 5,991,188 A * | 11/1999 | Chung et al. ................ 365/145 |
| 6,058,049 A * | 5/2000 | Kye et al. ............... 365/189.09 |
| 6,078,530 A * | 6/2000 | Choi ..................... 365/189.09 |
| 6,452,829 B1 * | 9/2002 | Yamada ..................... 365/145 |
| 6,574,133 B2 | 6/2003 | Takashima |

* cited by examiner

Primary Examiner—Richard Elms
Assistant Examiner—Eric J. Wendler
(74) Attorney, Agent, or Firm—Marger Johnson & McCollom, P.C.

(57) ABSTRACT

A ferroelectric memory device includes a plurality of memory cells, each memory cell includes a ferroelectric capacitor and a transistor, a plate line drive unit capable of providing a first voltage to the memory cell array in response to a plate line drive signal, and a reference voltage generating device. The reference voltage generating includes a reference cell block having a plurality of reference cells, each reference cell including a ferroelectric capacitor and a transistor, and a reference plate line drive to provide a reference plate line voltage to at least one reference cell in response to a plate line drive signal and a reference voltage generation signal, where each reference cell generates a reference voltage in response to the reference plate line voltage.

23 Claims, 5 Drawing Sheets

FERROELECTRIC MEMORY DEVICE HAVING A REFERENCE VOLTAGE GENERATING CIRCUIT

CROSS REFERENCE TO RELATED APPLICATIONS

This application claims priority from Korean Patent Application No. 2003-91049, filed on Dec. 15, 2003, which is incorporated here by reference.

BACKGROUND OF THE INVENTION

1. Field of the Invention

The field of the invention relates to a ferroelectric memory device and, more particularly, to a reference voltage generating circuit for generating a reference voltage capable of reading data from ferroelectric memory cells.

2. Description of the Related Art

Nonvolatile memory continuously stores data even after a memory power source is cutoff. Ferroelectric memory employing ferroelectric materials, such as lead zirconium titanate (PZT), have a hysteresis characteristic capable of not only providing non-volatility but also low power consumption and speedy operation.

A ferroelectric memory is typically constructed of a ferroelectric capacitor and an access transistor. When voltage is applied to the ferroelectric capacitor, ferroelectric material is polarized according to the direction of the applied electric field, and a logic state "1" or "0" is stored in conformity with the electrical polarization. An 1T/1C ferroelectric memory cell stores data using a switching region for data "1" and a non-switching region for data "0". In order to read the data stored in the memory cell, a first voltage is applied to the ferroelectric capacitor and a second voltage is supplied to a bit line, where the bit line voltage is compared with a reference voltage to read the data of the memory cell as a logical "1" or "0". Thus, the ferroelectric memory requires a reference voltage generating circuit for generating the reference voltage. A nonvolatile memory device having a dummy cell circuit to generate a reference voltage is disclosed in U.S. Pat. No. 6,574,133 entitled "Nonvolatile ferroelectric memory device having dummy cell circuit."

Figure 1:
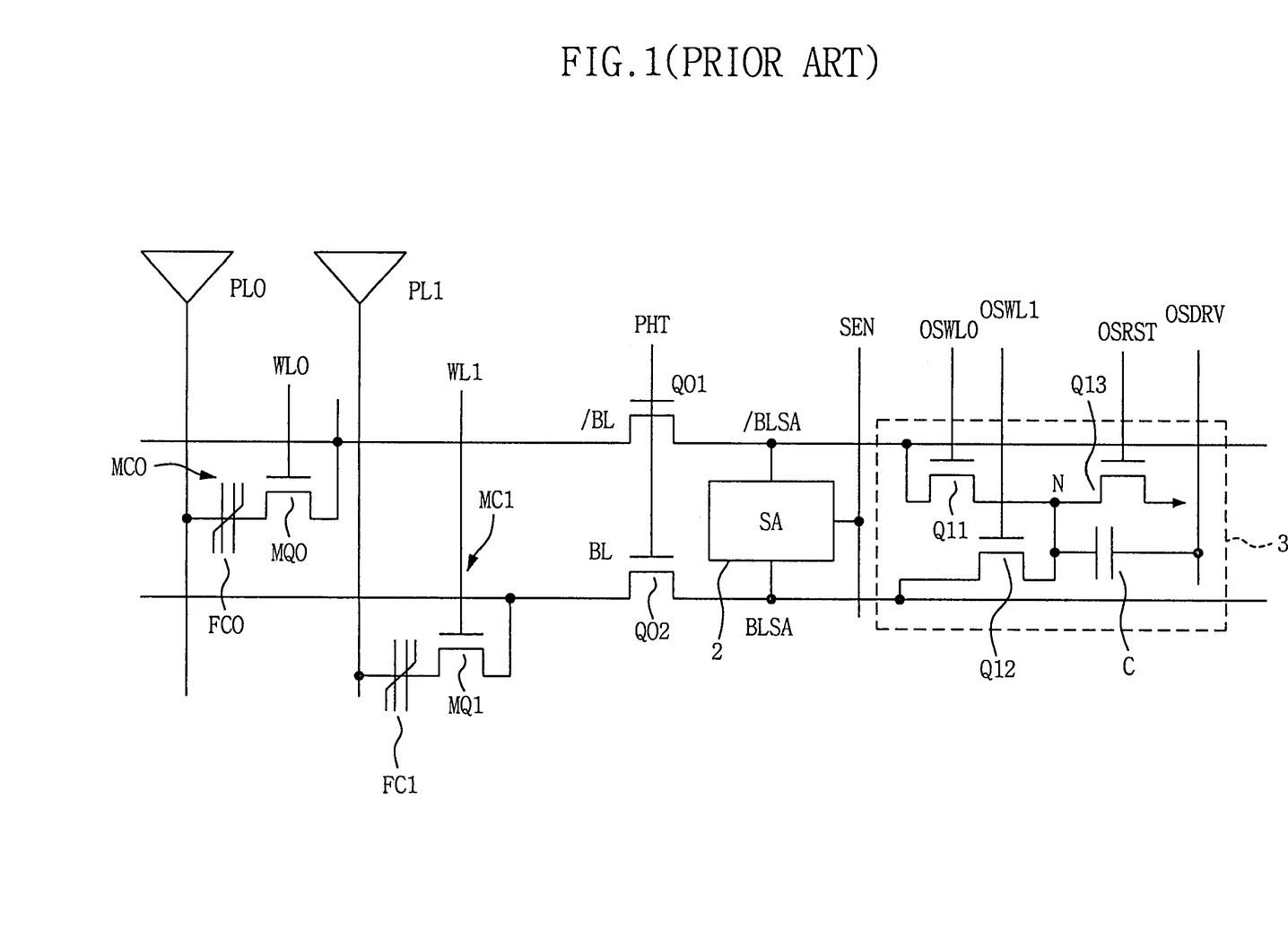
FIG. 1 is a diagram illustrating a reference voltage generating circuit according to a prior art.

FIG. 1 illustrates the voltage generating circuit disclosed in U.S. Pat. No. 6,574,133 and FIG. 2 is a timing diagram of the reference voltage generating circuit referred to in FIG. 1.

Referring to FIG. 1, a voltage generating circuit is comprised of a memory cell array,
  a sense amplifier 2, and a bit line voltage control circuit
    3. The memory cell array is composed of memory cells
    MC0 and MC1, each comprised of a ferroelectric
    capacitor FC0 and FC1 and an access transistor MQ0
    and MQ1, respectively. One end of ferroelectric capacitors FC0 and FC1 is connected to plate lines PL0 and
    PL1, respectively, while another end is connected to bit
    lines /BL and BL through NMOS transistors MQ0 and
    MQ1, respectively. Each gate of the NMOS transistors
    MQ0 and MQ1 is connected to word lines WL0 and
    WL1, respectively.
  Bit lines /BL and BL are connected to a sense amplifier 2 at sense node /BLSA and BLSA through NMOS transistors Q01 and Q02, respectively, when NMOS transistors Q01 and Q02 are selected by signal PHT. Sense amplifier 2 is coupled to bit line voltage control circuit 3 at sense node /BLSA and BLSA. Sense amplifier 2 is enabled by enable signal SEN.

Bit line voltage control circuit 3 is capable of controlling the voltage in bit lines /BL and BL, and includes a coupling capacitor C, NMOS transistors Q11 and Q12, and a reset NMOS transistor Q13. NMOS transistors Q11 and Q12 are coupled between coupling capacitor C at node N and sense nodes BLSA and /BLSA, respectively. When selected by control signals OSWL0 and OSWL1, respectively, NMOS transistors QI1 and Q12 couple a corresponding bit line with coupling capacitor C in order to lower the potential of the corresponding bit line. The reset NMOS transistor Q13 resets the voltage at node N when selected with a reset signal OSRST. Another end of the coupling capacitor C is connected to a drive signal OSDRV.

Figure 2:
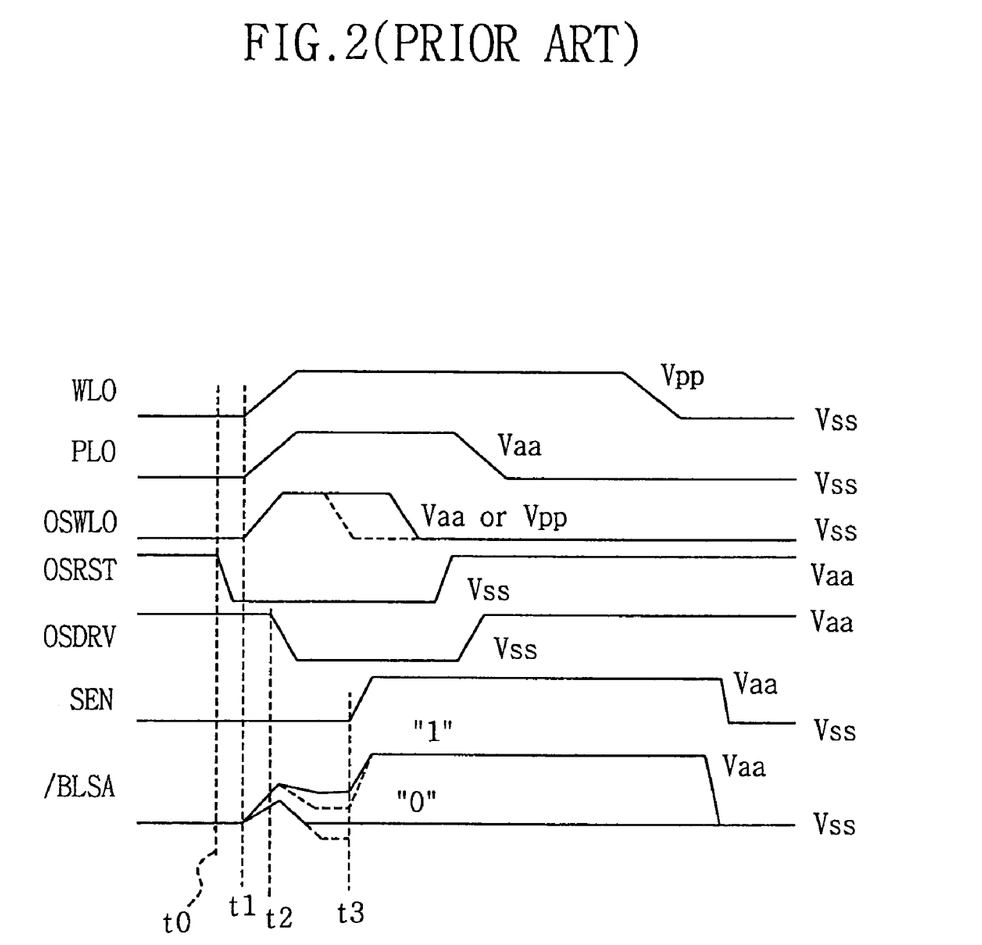
FIG. 2 is a timing diagram illustrating operations of a reference voltage generating circuit according to a prior art.

Referring to FIG. 2, a timing diagram shows a reading operation of memory cell MC0 of the voltage generating circuit. Prior to the execution of the reading operation, reference voltage generating circuit 3 is in a stand-by mode, where a reset signal OSRST is applied as a logical "H", and control signals OSWL0 and OSWL1 are applied as a logical "L". During stand-by mode, node N is maintained as 0V, coupling capacitor C is charged to Vaa·C by drive signal OSDRV of logical "H", and the bit line voltage of bit line /BL is precharged to Vss.

When performing a read operation, at time t0, reset transistor Q13 is turned off by a logical "L" of the reset signal OSRST, and at time t1, word line WL0, plate line PL0, signal PHT and control signal OSWL0 are simultaneously applied as a logical "H". As a result, transistor Q11 is turned on, and capacitor C is coupled to the sense node /BLSA, and bit line /BL. The bit line voltage of bit line /BL is consequently increased, where the magnitude of the increase is dependent on the logic state "1" or "0" stored by memory cell MC0. At time t2, drive signal OSDRV becomes a reference voltage of 0V by a logical "L" requiring the voltage at node N to become—Vaa, and thus lowering the voltage of bit line /BL and sense node /BLSA. At time t3, enable signal SEN is applied as a logical "H", enabling sense amplifier 2 to read data based on the voltage level at sense node /BLSA.

Accordingly, to read data from a memory cell that is constructed of one ferroelectric capacitor and one access transistor, a reference voltage generating circuit requires one coupling capacitor and three NMOS transistors for every sense amplifier. In order to generate a reference voltage having a medium voltage level, between the voltages corresponding to the logic states "1" and "0" of the data stored in ferroelectric memory cells, the capacitance and size of the coupling capacitor must increase, and thus the size of the reference voltage generating circuit must also increase. Furthermore, high integration of a ferroelectric memory device comprising a plurality of memory cells becomes difficult due to the size increase of the reference voltage generating circuit required to read the cells.

SUMMARY OF THE INVENTION

Some embodiments of the invention provide a ferroelectric memory device having a reference voltage generating circuit. The reference voltage generating circuit is composed of at least one reference cell comprising a ferroelectric capacitor and a transistor. The reference voltage generating circuit is driven in substantially the same direction as a word line, thereby substantially reducing the area of the reference voltage generating circuit.

The ferroelectric memory device having the reference voltage generating circuit is provided with a reference plate line drive unit. The reference plate line drive unit employs a plate line drive signal to supply a reference plate line voltage to at least one reference cell, thereby substantially reducing an area of the reference voltage generating circuit and the overall chip size. Since the reference cell performs a high number of switching operations relative to the main memory cell, the ferroelectric capacitor of the reference cell operates with a voltage lower than the operating voltage of the main memory cell ferroelectric capacitor, whereby improving a fatigue degradation of the ferroelectric capacitor of the reference cell.

BRIEF DESCRIPTION OF THE DRAWINGS

The above and other features of exemplary embodiments of the invention will become readily apparent from the description that follows, with reference to the attached drawings in which.

DETAILED DESCRIPTION OF THE INVENTION

Exemplary embodiments of the invention are more fully described in detail with reference to FIGS. 3 to 6. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

Figure 3:
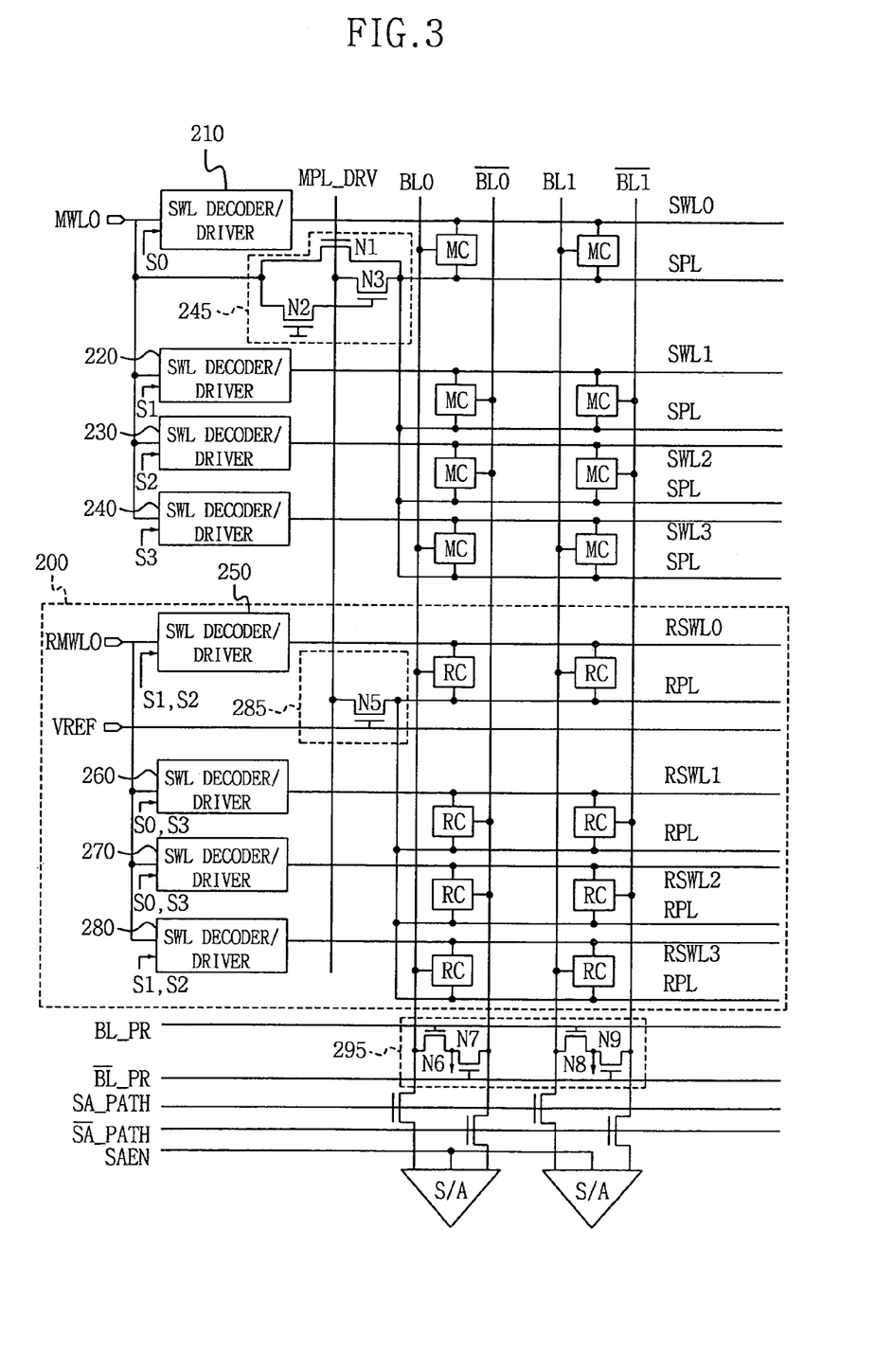
FIG. 3 is a block diagram of a ferroelectric memory device having a reference voltage generating circuit according to an exemplary embodiment of the invention.
Figure 4:
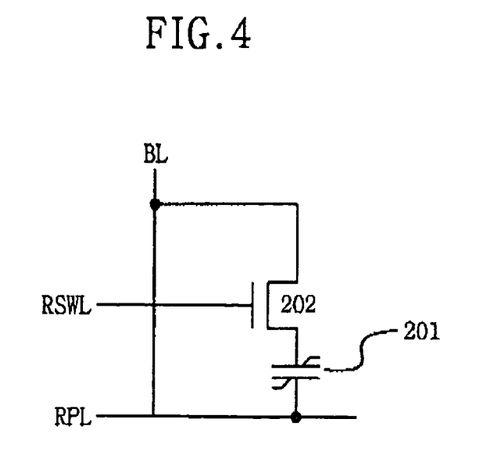
FIG. 4 is an equivalent circuit diagram of reference cell employed in the reference voltage generating circuit shown in FIG. 3.

FIG. 3 is a block diagram of a ferroelectric memory device having a reference voltage generating circuit according to an exemplary embodiment of the invention. FIG. 4 is an equivalent circuit diagram of a reference cell employed in the reference voltage generating circuit shown in FIG. 3.

Referring first to FIG. 3, according to an exemplary embodiment of the invention, a ferroelectric memory device having a reference voltage generating circuit largely includes a main memory cell array having a plurality of ferroelectric memory cells, a reference voltage generating circuit 200, and sense amplifiers S/A.

In the ferroelectric main memory cell array, memory cells MC, each of which is constructed of one ferroelectric capacitor and one access transistor, are arrayed at crossed points of rows and columns. The gate of each access transistor of each memory cell is connected to a word line SWL0, SWL1, SWL2 or SWL3. One end of the ferroelectric capacitor of each memory cell is connected to a plate line SPL, while another end of the ferroelectric capacitor of each memory cell is connected to a bit line BL0, $\overline{BL0}$, BL1, or $\overline{BL1}$ through the access transistor. The memory cell MC has the structure equal to or similar to a reference cell RC shown in FIG. 4, and will be described in detail below with reference to FIG. 4.

Word line decoders/drivers 210, 220, 230 and 240 enable word lines SWL0, SWL1, SWL2 and SWL3, respectively, in response to a main word line signal MWL0 and word line selection signals S0, S1, S2 and S3, respectively. The plate lines SPL are commonly connected to a plate line drive unit 245 for providing a plate line voltage VPL to the plate lines SPL in response to a plate line drive signal MPL_DRV, and main word line signal MWL0. Plate line drive unit 245 is constructed of three NMOS transistors N1, N2 and N3. One end of NMOS transistor N1 is commonly connected with the main word line signal MWL0 and one end of NMOS transistor N2. Another end of NMOS transistor N1 is commonly connected with the plate lines SPL and one end of NMOS transistor N3, while the gate of NMOS transistor N1 is connected to the plate line drive signal MPL_DRV. Another end of NMOS transistor N2 is connected to a gate of NMOS transistor N3. Another end of NMOS transistor N3 is connected to the plate line drive signal MPL_DRV.

The reference voltage generating circuit 200 includes a reference cell array, word line decoder/drivers 250, 260, 270 and 280, a reference plate line drive unit 285. Reference cells RC constituting the reference cell array are each constructed of one ferroelectric capacitor 201 and one access transistor 202. As shown in FIG. 4, the reference cell RC has the structure similar to the configuration of a ferroelectric main memory cell MC. A gate of the access transistor 202 is connected to a word line RSWL, while one end is connected to a bit line BL, and the other end is connected to one end of the ferroelectric capacitor 201. The other end of the ferroelectric capacitor 201 is connected to the plate line RPL. Word line RSWL designates a reference word line and the plate line RPL designates a reference plate line.

The reference cell array has a structure similar to the main memory cell array, where each main memory cell is arrayed at cross-points of a row and a column. The access transistor of each reference cell is connected to one reference word line RSWL0, RSWL1, RSWL2 or RSWL3. One end of ferroelectric capacitor of each reference cell is connected to the reference plate line RPL, while the other end is connected to a bit line BL0, $\overline{BL0}$, BL1, or $\overline{BL1}$ through the access transistor.

Word line decoders/drivers 250, 260, 270 and 280 enable reference word lines RSWL0, RSWL1, RSWL2 and RSWL3, respectively, in response to a reference main word line signal RMWL0 and selected word line selection signals S0, S1, S2 and S3. For example, when the reference main word line signal RMWL0 is applied as a logic "H" and an S0 signal is selected, the word line decoder/drivers 260 and 270 enable second and third reference word lines RSWL1 and RSWL2.

Reference plate line drive unit 285 is constructed of one NMOS transistor N5 capable of providing a determined reference plate line voltage VRPL to the reference plate lines RPL with a switching operation in response to the plate line drive signal MPL_DRV and the reference voltage generation signal VREF. The drain of NMOS transistor N5 is connected to the plate line drive signal MPL_DRV, the source is connected to the reference plate lines RPL, and the gate is connected to the reference voltage generation signal VREF. When plate line drive signal MPL_DRV and reference voltage generation signal VREF of first level are applied as a logical "H", NMOS transistor N5 is turned on to provide a reference plate line voltage VRPL of a second level to the reference plate lines RPL. The reference plate line voltage VRPL is represented as a difference (VREF−Vth=VRPL) between the first voltage level VREF of the reference voltage generation signal and a threshold voltage level Vth of the NMOS transistor N5. Reference plate line voltage VRPL provided to the reference plate line RPL has a level lower than the plate line voltage VPL provided to the plate line SPL of the main memory cell. A level of the reference plate line voltage VRPL can be controlled by controlling a voltage level of the reference voltage generation signal VREF.

Precharge unit 295 is composed of four NMOS transistors N6, N7, N8, and N9 each having one end connected to bit lines BL0, $\overline{BL0}$, BL1, and $\overline{BL1}$, respectively, while the other ends of NMOS transistors N6 and N7 and NMOS transistors N8 and N9 are grounded commonly. The gates of NMOS transistors N6 and N8 are connected to a bit line precharge signal $\overline{BL\_PR}$, and the gates of NMOS transistors N7 and N9 are connected to a complementary bit line precharge signal $\overline{BL\_PR}$. In the precharge unit 295 the bit lines BL0 and BL1 coupled with the reference cell array are grounded in response to the bit line precharge signal BL_PR, thereby data of the reference cells is automatically written to a logic state of "0". Also, the complementary bit lines $\overline{BL0}$ and $\overline{BL1}$ coupled with the reference cell array are grounded in response to the complementary bit line precharge signal $\overline{BL\_PR}$, thereby data of the reference cells is automatically written to a logic state of "0".

Sense amplifiers S/A are each coupled to a bit line pair BL0 and $\overline{BL0}$, and BL1 and $\overline{BL1}$, respectfully, where the level of the bit line voltage connected to the main memory cell on one bit line of a bit line pair and a level of the reference bit line voltage connected to the reference cell on the other bit line in the bit line pair, is sensed by a sense amplifier and used to read the data of the main memory cell as a logic state of "0" or "1". Between the sense amplifier S/A and precharge unit 295, NMOS transistors are configured to connect the sense amplifiers with the bit lines in response to a sense amplifier path signal SA_PATH or complementary sense amplifier path signal $\overline{SA\_PATH}$.

Next, an operation of the ferroelectric memory device having the reference voltage generating circuit will be described according to an exemplary embodiment of the invention, as follows.

When the MWL0 main word line signal and the S0 signal are applied to the word line decoder/driver 210, the word line decoder/driver 210 enables a selected SWL0 word line. When the plate line drive signal MPL_DRV is applied to the plate line drive unit 245, plate line drive unit 245 provides a plate line voltage VPL to the plate lines SPL. Subsequently, a voltage VBL0 or VBL1 corresponding to data of a selected main memory cell is provided to the bit line BL0.

When the RMWL0 main word line signal and the S0 signal are applied to the reference word line decoder/driver 260 and 270 enables selected RSWL1 and RSWL2 word lines. When the plate line drive signal MPL_DRV and the reference voltage generation signal VREF are applied to reference plate line drive unit 285, the reference plate line drive unit 285 is enabled to provide the reference plate line voltage VRPL to the reference plate lines RPL. Subsequently, a reference voltage VBLR is provided to the bit line $\overline{BL0}$ coupled with two selected reference cells. The reference cells operate at a non-switching region of the ferroelectric capacitor corresponding to stored data with a logic state of "0" of the main memory cell, thus the two selected reference cells provide the reference voltage VBLR to the bit line $\overline{BL0}$. The reference voltage VBLR may be controlled by the voltage level of the reference plate line voltage VRPL, while the reference plate line voltage VRPL can be controlled by the voltage level of the reference voltage generation signal VREF. That is, the voltage level of the reference voltage generation signal VREF may be controlled, so that the reference plate line voltage VRPL provided to the reference plate line has a voltage level lower than the plate line voltage VPL provided to the plate line SPL of the main memory cell, where, preferably, reference voltage VBLR has a voltage level corresponding to a medium level between bit line voltage VBL0 corresponding to stored data with a logic state of "0" and bit line voltage VBL1 corresponding to stored data with a logic state of "1". The bit line voltage connected to the selected main memory cell and the bit line voltage connected to the reference cell are sensed in the sense amplifier S/A and used to read the data of the selected main memory cell.

Figure 5:
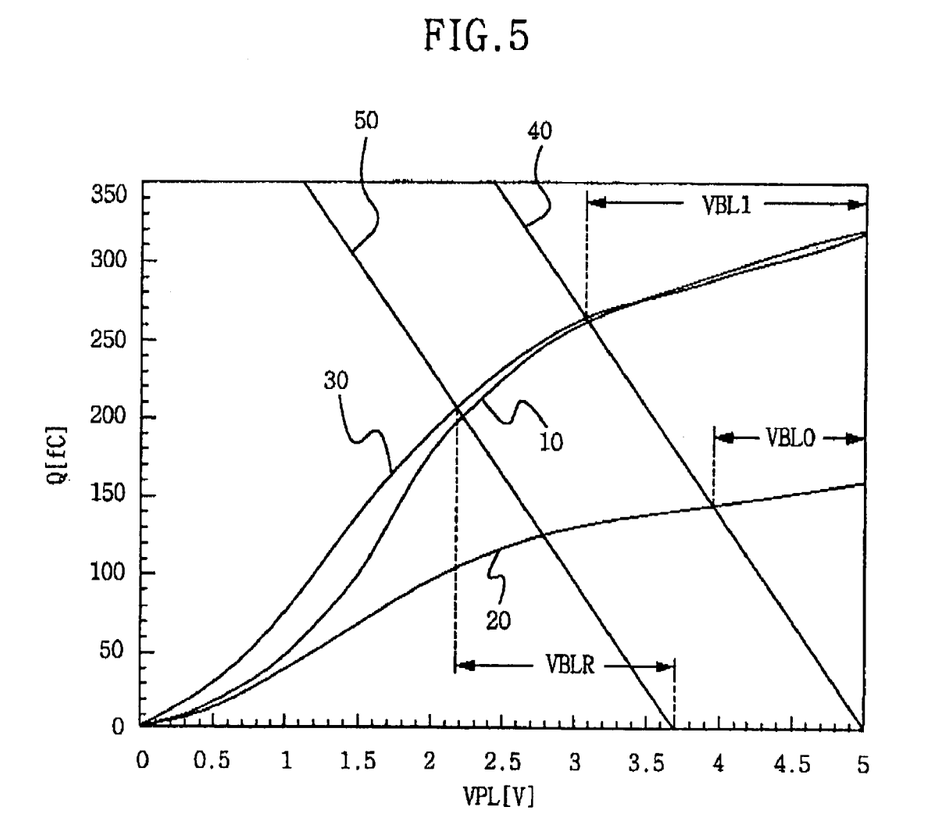
FIG. 5 is a graph illustrating hysteresis characteristics of a ferroelectric capacitor according to an exemplary embodiment of the invention.

FIG. 5 is a graph illustrating hysteresis characteristics of the ferroelectric capacitor according to an exemplary embodiment of the invention. In FIG. 5, a transverse axis of the graph indicates a plate line voltage VPL(V) and a longitudinal axis indicates a polarization amount Q(fC) of the ferroelectric capacitor.

As shown in FIG. 5, when 5V is applied to the plate line of the main memory cell, and data of the main memory cell corresponds to a logic state of "1", a bit line voltage VBL1 of 1.95 V is provided to bit line BL0. Bit line voltage VBL1 is obtained by deducting a crossed point voltage 3.05V from a plate line voltage of 5V, where the crossed point voltage is between a switching region 10 of the ferroelectric capacitor switching Csw curved line and a load straight line 40 corresponding to the bit line capacity. When data of the ferroelectric memory cell corresponds to a logic state of "0", a voltage VBL0 of 1.1 V is provided to bit line BL0. Voltage VBL0 is obtained by deducting a crossed point voltage 3.9V from the plate line voltage of 5V, where the crossed point voltage is between the non-switching region 20 of the ferroelectric capacitor non-switching Cnsw curved line and the load straight line 40 corresponding to the bit line capacity.

When reference voltage generation signal VREF is controlled so that the reference plate line voltage VRPL becomes 3.7V, the ferroelectric capacitors of two selected reference cells operate at the non-switching region and the plate line voltage level of the reference cell is lower than the plate line voltage level of the main memory cell. Thus, a voltage VBLR of 1.52 V is provided to the bit line BL0. Voltage VBLR is obtained by deducting a crossed point voltage 2.18V from reference plate line voltage of 3.7V, where the crossed point voltage is between a non-switching Cnws curved line 30 and a load straight line 50 corresponding to the bit line capacity. In other words, when data of the selected main memory cell corresponds to a logic state of "1", 1.95V is provided to the bit line, and a reference voltage 1.52V is provided to the complementary bit line, thus a voltage difference of bit lines is sensed by sense amplifier S/A and the data is read as a logical "1". Otherwise, when data of the selected main memory cell corresponds to a logic state of "0", 1.1 V is provided to the bit line, and a reference voltage 1.52V is provided to the complementary bit line, then a voltage difference of bit lines is sensed by sense amplifier S/A and the data is read as a logical "0". Although a reference plate line voltage VRPL of 3.7V was described above, many applied reference plate line voltages VRPL may be implemented.

Figure 6:
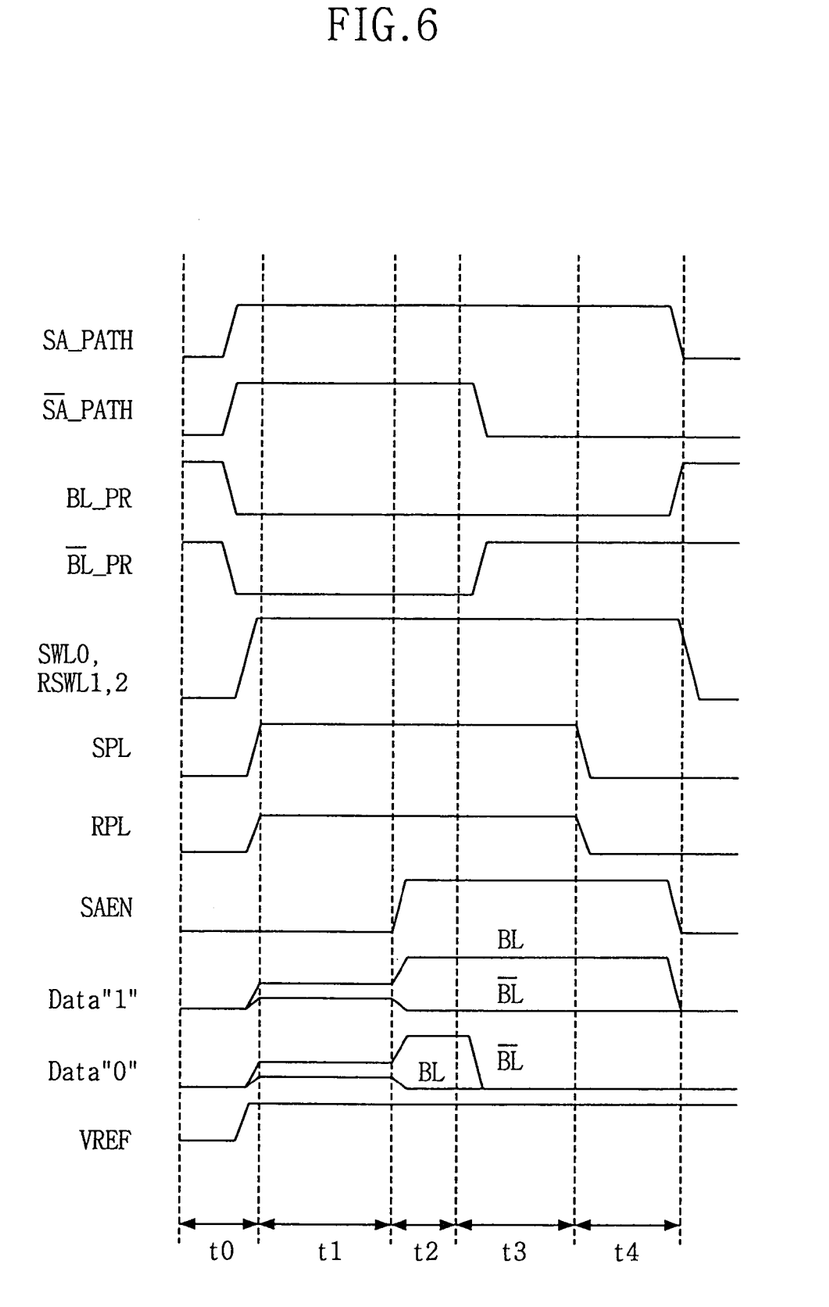
FIG. 6 is a timing diagram illustrating operations of the reference voltage generating circuit referred to in FIG. 3, according to an exemplary embodiment of the invention.

FIG. 6 is a timing diagram illustrating operations of the reference voltage generating circuit referred to in FIG. 3, according to an exemplary embodiment of the invention.

When the MWL0 main word line signal and S0 signal are applied as a logical "H" to the word line decoder/driver 210, the sense amplifier and complementary sense amplifier path signals SA_PATH and $\overline{\text{SA\_PATH}}$ are enabled to connect bit line pairs to their respective sense amplifier. Before the MWL0 main word line signal and S0 signal are applied as a logical "H", the bit line and complementary bit line precharge signals BL_PR and $\overline{\text{BL\_PR}}$ are enabled to precharge the bit lines, thus allowing the voltage to float. At the same time as the MWL0 main word line signal and S0 signal are applied as the logical "H", the bit line and complementary bit line precharge signals BL_PR and $\overline{\text{BL\_PR}}$ are disabled.

Word line decoder/driver 210 enables SWL0 word line in response to MWL0 main word line signal and S0 signal, word line decoder/drivers 260 and 270 enable RSWL1 and RSWL2 reference word lines in response to RMWL0 reference word line signal and S0 signal, plate line voltage VPL is provided to the plate lines SPL, and reference plate line voltage VRPL is provided to the reference plate lines RPL. Subsequently, a voltage corresponding to data of the selected main memory cell, VBL0 or VBL1, is provided to the bit line BL0, and the reference voltage VBLR is provided to the bit line $\overline{\text{BL0}}$ by the two selected reference cells. A voltage difference of the bit lines BL0 and $\overline{\text{BL0}}$ is sensed by sense amplifier S/A in response to the sense amplifier enable signal SAEN, and the value of the data stored in the selected memory cell is read accordingly.

When the data read operation is completed, the main memory cell returns to previous state, while the selected reference cells are reset to "0" in one cycle. The selected reference cells are reset to "0" by disabling the complementary sense amplifier path signal $\overline{\text{SA\_PATH}}$ to cut off the sense amplifier and complementary bit lines $\overline{\text{BL0}}$ and $\overline{\text{BL1}}$, and enabling the complementary bit line precharge signal $\overline{\text{BL\_PR}}$ to ground the complementary bit lines $\overline{\text{BL0}}$ and $\overline{\text{BL1}}$. Thus the data of in the selected reference cells is automatically written as to a logical "0". In the case where S1 signal is applied as a logical "H" instead of S0 signal, a reference voltage is provided to the bit line BL0 instead of $\overline{\text{BL0}}$. Thus, after the data read operation is completed, a sense amplifier path signal SA_PATH is disabled to cut off the sense amplifier and the bit lines BL0 and BL1, and the bit line precharge signal BL_PR is enabled to automatically write the data of the selected reference cells to a logical "0" in one cycle, via the bit line BL0. This automatic resetting of the selected reference cells at the end of the read operation allows a reference voltage necessary for the next cycle to be supplied to a bit line without an additional operation for writing the reference cell to "0".

As described above, in the ferroelectric memory device having a reference voltage generating circuit according to an exemplary embodiment of the invention, the reference voltage generating circuit is constructed of at least one reference cell that has the structure similar to a main memory cell, the main memory cell being constructed of one ferroelectric capacitor and one transistor. The reference voltage generating circuit is driven in a direction of a word line, thereby substantially reducing an area of the reference voltage generating circuit and thus the chip size. The reference plate line drive unit using a plate line drive signal to provide a voltage to a plate line of the memory cell substantially reduces the area of the reference voltage generating circuit, and thus reduces a chip size.

Since, a reference cell performs more switching operations than a main memory cell, a fatigue effect in which a residual polarization from polarization of ferroelectric material is reduced in proportionate to the switching inversion number, is generated more frequently than the main memory cell. Meanwhile, in the ferroelectric memory device having the inventive reference voltage generating circuit, the ferroelectric capacitor of reference cell operates at a lower voltage than the ferroelectric capacitor of the main memory cell, thereby improving a fatigue degradation characteristic of the reference cell.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents.

I claim:

1. A reference voltage generating device comprising:
   a reference cell block having a plurality of reference cells, each reference cell including a ferroelectric capacitor and a transistor;
   a reference plate line drive unit to provide a reference plate line voltage to at least one reference cell in response to a plate line drive signal and a reference voltage generation signal;
   where the reference plate line voltage provided to access the reference cell is lower than a plate line voltage provided to access at least one main memory cell; and
   where each reference cell generates a reference voltage in response to the reference plate line voltage.

2. The reference voltage generating device of claim 1 where each reference cell operates at a non-switching region of the ferroelectric capacitor.

3. The reference voltage generating device of claim 1 where the reference plate line drive unit comprises only one MOS transistor to switch the reference plate line voltage to at least one reference cell in response to the plate line drive signal and the reference voltage generation signal.

4. The reference voltage generating device of claim 1 where the plate line drive signal provides the plate line voltage to at least one main memory cell.

5. The reference voltage generating device of claim 4 where each main memory cell includes a ferroelectric capacitor and a transistor.

6. The reference voltage generating device of claim 1 comprising:
   a plurality of reference word lines, each word line coupled to at least one the reference cell transistor; and
   a plurality of word line drivers, each driver capable of enabling at least one reference word line in response to a reference main word line signal and a word line selection signal.

7. The reference voltage generating device of claim 1 where the reference plate line voltage and the plate line voltage are non-zero.

8. A reference voltage generating device comprising:
   a reference cell block having a plurality of reference cells, each reference cell including a ferroelectric capacitor and a transistor;
   a reference plate line drive to provide a reference plate line voltage to at least one reference cell in response to a plate line drive signal and a reference voltage generation signal;
   where each reference cell generates a reference voltage in response to the reference plate line voltage;
   where the reference plate line drive unit comprises a MOS transistor to switch the reference plate line voltage to at least one reference cell in response to the plate line drive signal and the reference voltage generation signal;

where a drain of the MOS transistor is coupled with the plate line drive signal;

where a source of the MOS transistor is coupled to at least one plate line, each plate line to provide the reference plate line voltage to at least one reference cell; and where a gate of the MOS transistor is coupled with the reference voltage generation signal.

9. A reference voltage generating device comprising:

a reference cell block having a plurality of reference cells, each reference cell including a ferroelectric capacitor and a transistor;

a reference plate line drive to provide a reference plate line voltage to at least one reference cell in response to a plate line drive signal and a reference voltage generation signal;

where each reference cell generates a reference voltage in response to the reference plate line voltage;

where the reference plate line drive unit comprises a MOS transistor to switch the reference plate line voltage to at least one reference cell in response to the plate line drive signal and the reference voltage generation signal;

where the reference plate line voltage is a difference between a voltage of the reference voltage generation signal and a threshold voltage of the MOS transistor; and where the reference plate line voltage can be controlled by controlling a voltage level of the reference voltage generation signal.

10. A reference voltage generating device comprising:

a reference cell block having a plurality of reference cells, each reference cell including a ferroelectric capacitor and a transistor; and a reference plate line drive to provide a reference plate line voltage to at least one reference cell in response to a plate line drive signal and a reference voltage generation signal;

where each reference cell generates a reference voltage in response to the reference plate line voltage;

a plurality of bit lines, each pair of bit lines is coupled to at least one reference cell and at least one main memory cell, where each pair of bit lines receives a voltage from a main memory cell on one bit line, and the reference voltage on the other bit line;

where each pair of bit lines is coupled to a precharge unit capable of grounding one of the bit lines in response to a bit line precharge signal and grounding the other bit line in response to a complementary bit line precharge signal.

11. The reference voltage generating device of claim 10 where the voltage from the main memory cell corresponding to a stored "0" value is lower than the voltage from the main memory cell corresponding to a stored "1" value; and where the reference voltage has a voltage level between the voltage of the stored "0" value and the stored "1" value.

12. The reference voltage generating device of claim 10 where each pair of bit lines is coupled to a sense amplifier capable of sensing a voltage difference in the lines of the pair.

13. The reference voltage generating device of claim 10 where the precharge unit comprises two NMOS transistors coupled to a ground terminal.

14. The reference voltage generating device of claim 10 where grounding the bit line writes data to the reference cells as a "0" value.

15. A ferroelectric memory device comprising:

a memory cell array having a plurality of memory cells, each memory cell comprising a ferroelectric capacitor and a transistor;

a plate line drive unit capable of providing a first voltage to the memory cell array in response to a plate line drive signal;

a reference cell array having a plurality of reference cells, each reference cell comprising a ferroelectric capacitor and a transistor; and a reference plate line drive unit capable of providing a second voltage to the reference cell array in response to the plate line drive signal and a reference voltage generation signal, where the second voltage is lower than the first voltage.

16. The ferroelectric memory device of claim 15 comprising at least one sense amplifier, each sense amplifier capable of sensing a voltage difference in a bit line coupled to a memory cell and a bit line coupled to at least one reference cell.

17. The ferroelectric memory device of claim 15 comprising:

at least one reference word line driver, each reference word line driver capable of enabling at least one reference word line in response to a reference word line signal and a corresponding word line selection signal; and at least one word line driver, each word line driver capable of enabling at least one word line in response to a main word line signal and a corresponding word line selection signal.

18. The ferroelectric memory device of claim 15 comprising a precharge unit capable of grounding bit lines coupled to the reference cell array in response to a bit line precharge signal.

19. The ferroelectric memory device of claim 18 comprising a where the precharge unit grounds one of the bit lines in response to the bit line precharge signal and grounds the other bit line in response to a complement of the bit line precharge signal.

20. The ferroelectric memory device of claim 15 where the reference plate line drive unit comprises only one MOS transistor to switch the second voltage to at least one reference cell in response to the plate line drive signal and the reference voltage generation signal.

21. The ferroelectric memory device of claim 20 where a drain of the MOS transistor is coupled with the plate line drive signal;

where a source of the MOS transistor is coupled to at least one plate line, each plate line to provide the second voltage to at least one reference cell; and where a gate of the MOS transistor is coupled with the reference voltage generation signal.

22. The ferroelectric memory device of claim 20 where the second voltage is a difference between a voltage of the reference voltage generation signal and a threshold voltage of the MOS transistor; and where the second voltage is controllable by controlling a voltage level of the reference voltage generation signal.

23. The ferroelectric memory device of claim 15 where the first and second voltages are non-zero.

* * * * *

UNITED STATES PATENT AND TRADEMARK OFFICE
CERTIFICATE OF CORRECTION

PATENT NO. : 7,177,174 B2
APPLICATION NO. : 11/014117
DATED : February 13, 2007
INVENTOR(S) : Byung-Gil Jeon

Page 1 of 1

It is certified that error appears in the above-identified patent and that said Letters Patent is hereby corrected as shown below:

Column 2, line 8, the word "QI1" should read -- Q11 --.

Signed and Sealed this

Twenty-sixth Day of August, 2008

JON W. DUDAS
*Director of the United States Patent and Trademark Office*